United States Patent
Fox et al.

(10) Patent No.: US 10,161,034 B2
(45) Date of Patent: Dec. 25, 2018

(54) RAPID CHAMBER CLEAN USING CONCURRENT IN-SITU AND REMOTE PLASMA SOURCES

(71) Applicant: Lam Research Corporation, Fremont, CA (US)

(72) Inventors: Keith Fox, Tigard, OR (US); Jonathan Church, Portland, OR (US); James Lee, Damascus, OR (US); Matthew Mudrow, Tigard, OR (US); Kevin Gerber, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 21 days.

(21) Appl. No.: 15/493,972

(22) Filed: Apr. 21, 2017

(65) Prior Publication Data

US 2018/0305814 A1   Oct. 25, 2018

(51) Int. Cl.

| C23C 16/44 | (2006.01) |
|---|---|
| H01J 37/32 | (2006.01) |
| C23C 16/40 | (2006.01) |
| H01L 21/02 | (2006.01) |
| B08B 9/08 | (2006.01) |
| C23C 16/505 | (2006.01) |
| C23C 16/455 | (2006.01) |
| B08B 7/00 | (2006.01) |

(52) U.S. Cl.
CPC ........ *C23C 16/4405* (2013.01); *B08B 7/0035* (2013.01); *B08B 9/0865* (2013.01); *C23C 16/402* (2013.01); *C23C 16/45525* (2013.01); *C23C 16/505* (2013.01); *H01J 37/32862* (2013.01); *H01L 21/0228* (2013.01); *H01L 21/02164* (2013.01); *H01L 21/02216* (2013.01); *H01L 21/02271* (2013.01); *H01J 2237/335* (2013.01)

(58) Field of Classification Search
None
See application file for complete search history.

(56) References Cited

U.S. PATENT DOCUMENTS

| 5,413,670 A | 5/1995 | Langan et al. |
|---|---|---|
| 7,588,036 B2 | 9/2009 | Cui et al. |
| 7,875,125 B2 | 1/2011 | Cook et al. |
| 8,262,800 B1 | 9/2012 | Wongsenakhum et al. |
| 8,303,719 B2 | 11/2012 | Lee et al. |
| 8,591,659 B1 | 11/2013 | Fang et al. |
| 8,603,252 B2 | 12/2013 | Dimeo et al. |
| 8,623,148 B2 | 1/2014 | Mitchell et al. |
| 2003/0056388 A1 | 3/2003 | Ohno et al. |
| 2004/0045577 A1 | 3/2004 | Ji et al. |
| 2005/0082001 A1* | 4/2005 | Sugiura ............... B08B 7/0035 156/345.28 |
| 2005/0161060 A1 | 7/2005 | Johnson et al. |

(Continued)

*Primary Examiner* — Nicole Blan

(57) ABSTRACT

A method for cleaning a processing chamber of a substrate processing system includes supplying nitrogen trifluoride ($NF_3$) gas to a remote plasma source (RPS); generating RPS plasma using the RPS; supplying the RPS plasma to the processing chamber; supplying $NF_3$ gas as bypass gas to the processing chamber; striking in-situ plasma in the processing chamber while the RPS plasma is supplied; and cleaning the processing chamber during a cleaning period using both the RPS plasma and the in-situ plasma.

19 Claims, 6 Drawing Sheets

(56) References Cited

U.S. PATENT DOCUMENTS

| | | |
|---|---|---|
| 2005/0260354 A1 | 11/2005 | Singh et al. |
| 2006/0086376 A1 | 4/2006 | Dimeo et al. |
| 2009/0068844 A1 | 3/2009 | Pischtiak et al. |
| 2009/0314310 A1 | 12/2009 | Shishido |
| 2011/0041872 A1 | 2/2011 | Hogle et al. |
| 2011/0079241 A1 | 4/2011 | Sinha et al. |
| 2011/0108058 A1 | 5/2011 | Srivastava et al. |
| 2014/0053867 A1* | 2/2014 | Fang ................ H01J 37/32357 134/1.1 |

* cited by examiner

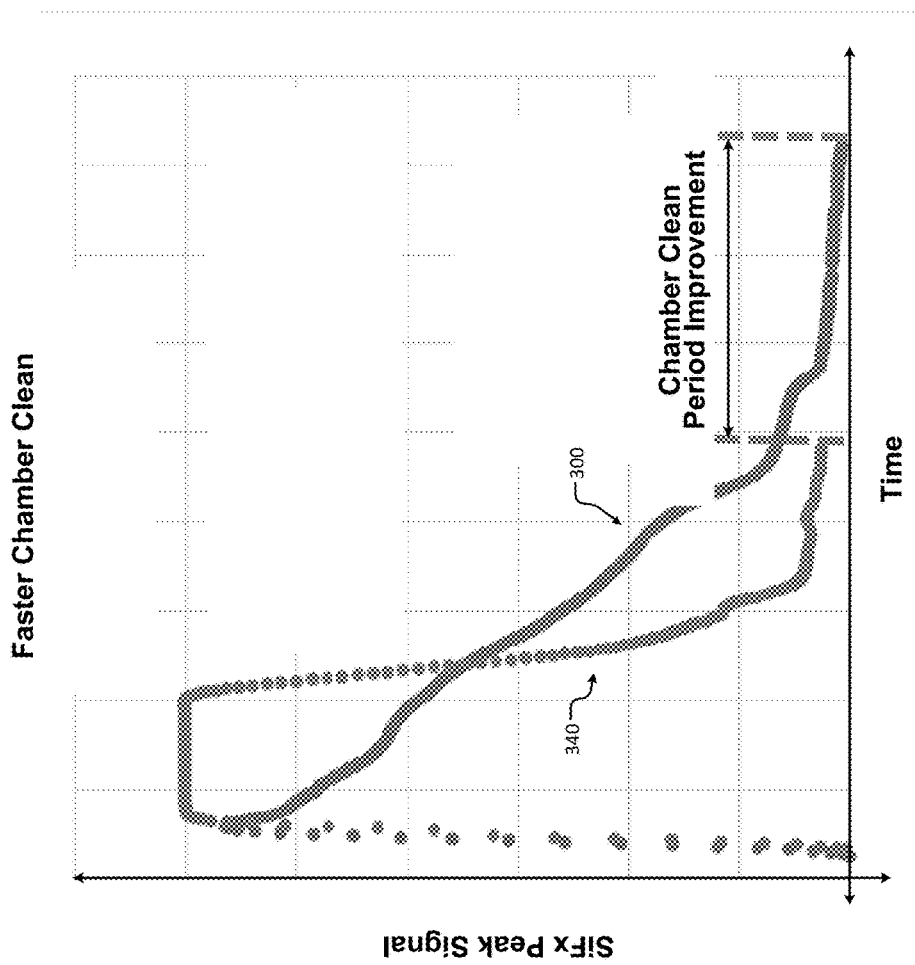

RAPID CHAMBER CLEAN USING CONCURRENT IN-SITU AND REMOTE PLASMA SOURCES

FIELD

The present disclosure relates to substrate processing systems, and more particularly to systems and methods for cleaning processing chambers of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, chemical vapor deposition (CVD), plasma enhanced chemical vapor deposition (PECVD), atomic layer deposition (ALD), plasma enhanced atomic layer deposition (PEALD) and/or other etch, deposition, and cleaning processes. A substrate may be arranged on a substrate support, such as a pedestal, an electrostatic chuck (ESC), etc. in a processing chamber of the substrate processing system. For example, during processing, a gas mixture is introduced into the processing chamber and plasma may be struck to enhance chemical reactions within the processing chamber.

After a number of substrates have been processed within the processing chamber, film and/or other reactants may build up on sidewalls of the processing chamber, the substrate support and other components located within the processing chamber. A chamber clean process is performed periodically to remove the buildup of film and/or other reactants. Since substrates cannot be processed during the chamber clean process, minimizing the time it takes to perform the chamber clean process is important.

SUMMARY

A method for cleaning a processing chamber of a substrate processing system includes supplying nitrogen trifluoride ($NF_3$) gas to a remote plasma source (RPS); generating RPS plasma using the RPS; supplying the RPS plasma to the processing chamber; supplying $NF_3$ gas as bypass gas to the processing chamber; striking in-situ plasma in the processing chamber while the RPS plasma is supplied; and cleaning the processing chamber during a cleaning period using both the RPS plasma and the in-situ plasma.

In other features, the method includes extinguishing the in-situ plasma and not supplying the RPS plasma to the processing chamber after the cleaning period. The substrate processing system performs chemical vapor deposition (CVD). The substrate processing system deposits silicon dioxide ($SiO_2$) on a substrate using oxide precursor gas. The oxide precursor gas comprises tetraethyl orthosilicate (TEOS) gas. The substrate processing system performs atomic layer deposition (ALD).

In other features, the substrate processing system deposits silicon dioxide ($SiO_2$) using oxide precursor gas. The oxide precursor gas comprises tetraethyl orthosilicate (TEOS) gas.

The in-situ plasma is generated using RF power in a range from 500 W to 3000 W. The in-situ plasma is generated using RF power in a range from 1000 W to 2000 W. The in-situ plasma is generated using RF power in a range from 1400 W to 1600 W.

In other features, a gas flow rate to the RPS is within a range from 90% to 110% of a most efficient flow rate for chamber operating parameters used during the method. A gas flow rate to the RPS is within a range from 95% to 105% of a most efficient flow rate for chamber operating parameters used during the method.

In other features, a gas flow rate of $NF_3$ gas to the RPS is in a range from 10 to 12 slm. A gas flow rate of $NF_3$ gas to the processing chamber is in a range from 3 to 5 slm.

In other features, the method includes maintaining a first pressure in the processing chamber during a first portion of the first period; and maintaining a second pressure that is different than the first pressure in the processing chamber during a second portion of the first period.

In other features, the first pressure is in a range from 2 to 4 Torr and the second pressure is in a range from 0.5 to 2 Torr. The method includes maintaining a temperature of the substrate support in a range between 350° C. and 650° C. during the first period. The method includes maintaining a temperature of the substrate support in a range between 445° C. and 550° C. during the first period.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 is a graph illustrating an example of reduced cleaning period for chamber clean processes according to the prior art and the present disclosure.

In the drawings, reference numbers may be reused to identify similar and/or identical elements.

DETAILED DESCRIPTION

Systems and methods according to the present disclosure are used to clean film and other reactants on interior surfaces of a substrate processing chamber at an increased etch rate to reduce the chamber clean cycle time. In some examples, the chamber clean can be improved from an etch rate of about 1.4 µm/min to greater than 5 µm/min. A remote plasma source (RPS) is supplied nitrogen trifluoride ($NF_3$) gas (or a mixture of $NF_3$ and inert gas) and RPS plasma is supplied to the processing chamber. While the RPS plasma is supplied, in-situ plasma is struck using bypass $NF_3$ gas as will be described further below. The dual path delivery of $NF_3$ to the RPS and bypass gas to the processing chamber allows for additional $NF_3$ flow into the processing chamber above a maximum and most efficient $NF_3$ flow rate through the RPS to achieve a higher etch rate.

Figure 1:
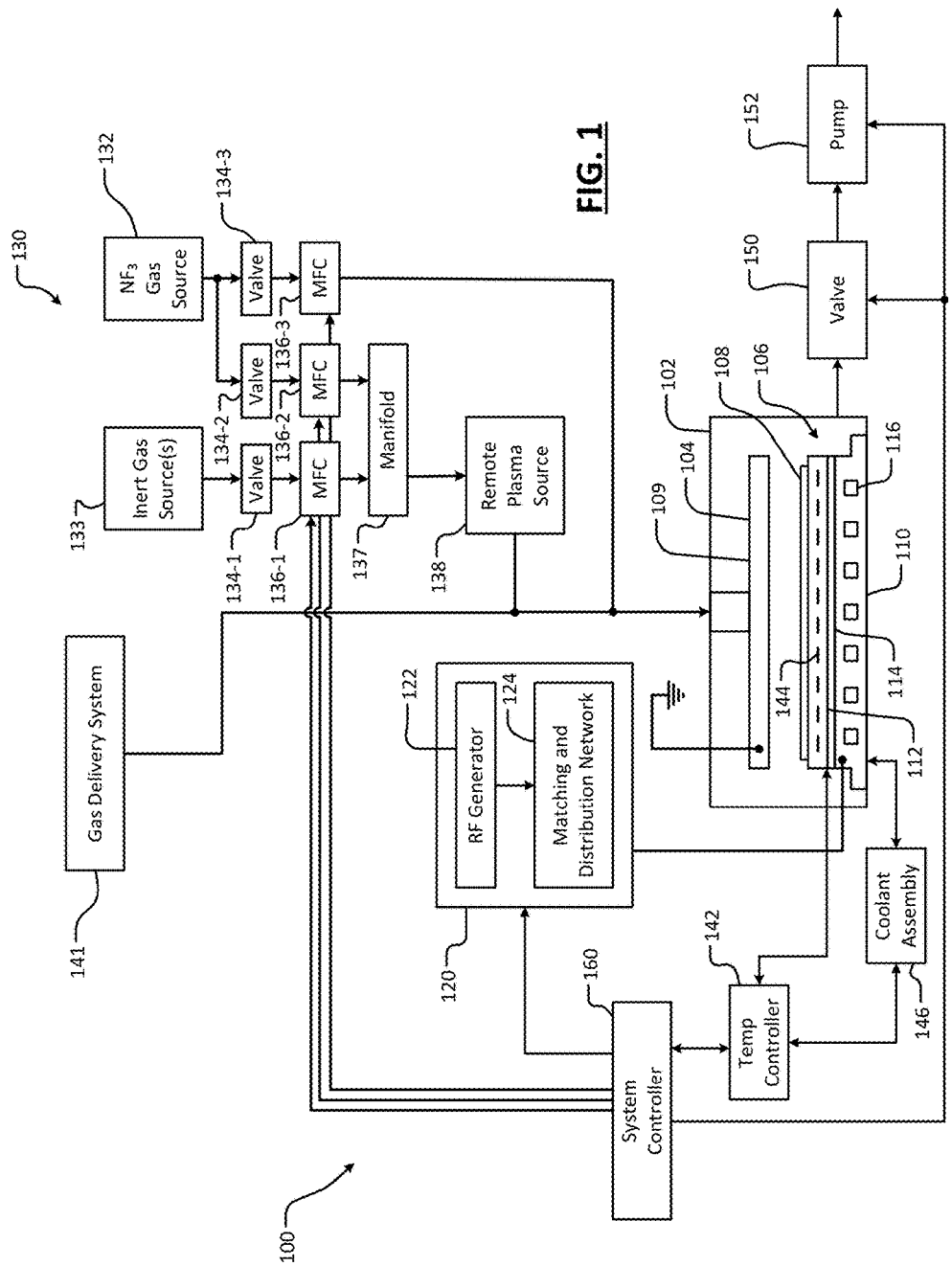
FIG. 1 is a functional block diagram of an example of a substrate processing system for treating substrates and in which a chamber clean process according to the present disclosure may be performed.

Referring now to FIG. 1, an example substrate processing system 100 for performing substrate treatment such as etching or deposition using RF plasma is shown. The substrate processing system 100 includes a processing chamber 102 that encloses other components of the substrate processing system 100 and contains the RF plasma. The substrate processing system 100 includes an upper electrode 104 and a substrate support 106, such as an electrostatic chuck (ESC). During operation, a substrate 108 is arranged on the substrate support 106.

For example only, the upper electrode 104 may include a showerhead 109 that introduces and distributes process and clean gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The baseplate 110 supports a heating plate 112, which may correspond to a ceramic multi-zone heating plate. The substrate support 106 includes a baseplate 110 that acts as a lower electrode. A thermal resistance layer 114 may be arranged between the heating plate 112 and the baseplate 110. The baseplate 110 may include one or more coolant channels 116 for flowing coolant through the baseplate 110.

An RF generating system 120 generates and outputs RF power to one of the upper electrode 104 and the lower electrode (e.g., the baseplate 110 of the substrate support 106). The other one of the upper electrode and the lower electrode may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively. In some examples, the RF generating system 120 supplies RF power in a range from 500 W to 3000 W. In some examples, the RF generating system 120 supplies RF power in a range from 1000 W to 2000 W. In some examples, the RF generating system 120 supplies RF power in a range from 1400 W to 1600 W. For example, the RF generating system 120 may supply RF power at 1500 W, although other RF power levels may be used. In some examples, the RF generating system 120 may operate at 13.26 MHz, although other frequencies may be used.

A first gas delivery system 130 includes one or more gas sources 132, 133 supplying nitrogen trifluoride ($NF_3$) gas and/or one or more inert gases, respectively. The gas sources 132, 133 are connected by one or more valves 134-1, 134-2, 134-3 to mass flow controllers (MFC) 136-1, 136-2, 136-3. Outputs of the MFCs 136-1 and 136-2 are fed to an optional mixing manifold 137, which is in fluid communication with a remote plasma source (RPS) 138. In some examples, the RPS 138 includes a microwave-based RPS, a plasma tube or other RPS.

The RPS 138 generates remote plasma that is selectively supplied to the processing chamber 102. In some examples, $NF_3$ is supplied to the RPS 138 at a most efficient flow rate for disassociation at the process parameters that are used. In some examples, the $NF_3$ is supplied to the RPS 138 at a rate within a range from 90 to 110% of the most efficient flow rate for disassociation. Typically the RPS 138 specifies efficiency based on chamber parameters such as pressure, temperature and/or cleaning gas species that are used. Some experimentation may be need for a particular recipe. In some examples, the $NF_3$ is supplied to the RPS 138 at a rate within 95 to 105% of the most efficient flow rate for disassociation.

The gas source 132 is connected by the valve 134-3 and the MFC 136-3 to the processing chamber 102. Alternately, a separate gas source may be used for the $NF_3$ bypass gas. In other words, the MFC 136-3 supplies bypass $NF_3$ gas to an output conduit from the RPS 138 or directly to the processing chamber 102. In some examples, the RPS plasma is started, the in-situ plasma is struck, both RPS and in-situ plasma are maintained for a cleaning period, the in-situ plasma is extinguished and then the RPS plasma is stopped. In other examples, the RPS plasma and in-situ plasma are started at approximately the same time, maintained during approximately the same cleaning period and stopped/extinguished at approximately the same time. In some examples, the RPS plasma may be maintained for predetermined periods before or after in-situ plasma is struck or extinguished, respectively.

A second gas delivery system 141 may include one or more valves, MFCs, and a manifold (not shown) for delivering other gases or gas mixtures such carrier gases, gas precursors and/or purge gases for use during substrate treatment prior to chamber cleaning and/or for purging the processing chamber. For example, the gas delivery system 141 may be used to supply a precursor including a silicon (Si) or silicon dioxide ($SiO_2$) precursor gas. In some examples, the precursor gas includes tetraethyl orthosilicate (TEOS) and silicon dioxide ($SiO_2$) film is deposited.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate (not shown). A temperature controller 142 may be used to control the plurality of TCEs 144 to control a temperature of the substrate support 106 and the substrate 108.

The temperature controller 142 may communicate with a coolant assembly 146 to control coolant flow through the coolant channels 116. For example, the coolant assembly 146 may include a coolant pump and reservoir. The temperature controller 142 operates the coolant assembly 146 to selectively flow the coolant through the coolant channels 116 to control the temperature of the substrate support 106.

A valve 150 and pump 152 may be used to evacuate reactants from the processing chamber 102. A system controller 160 may be used to control components of the substrate processing system 100. Although shown as separate controllers, the temperature controller 142 may be implemented within the system controller 160. The temperature controller 142 may be further configured to implement one or more models to estimate temperatures of the substrate support 106 according to the principles of the present disclosure.

Figure 2:
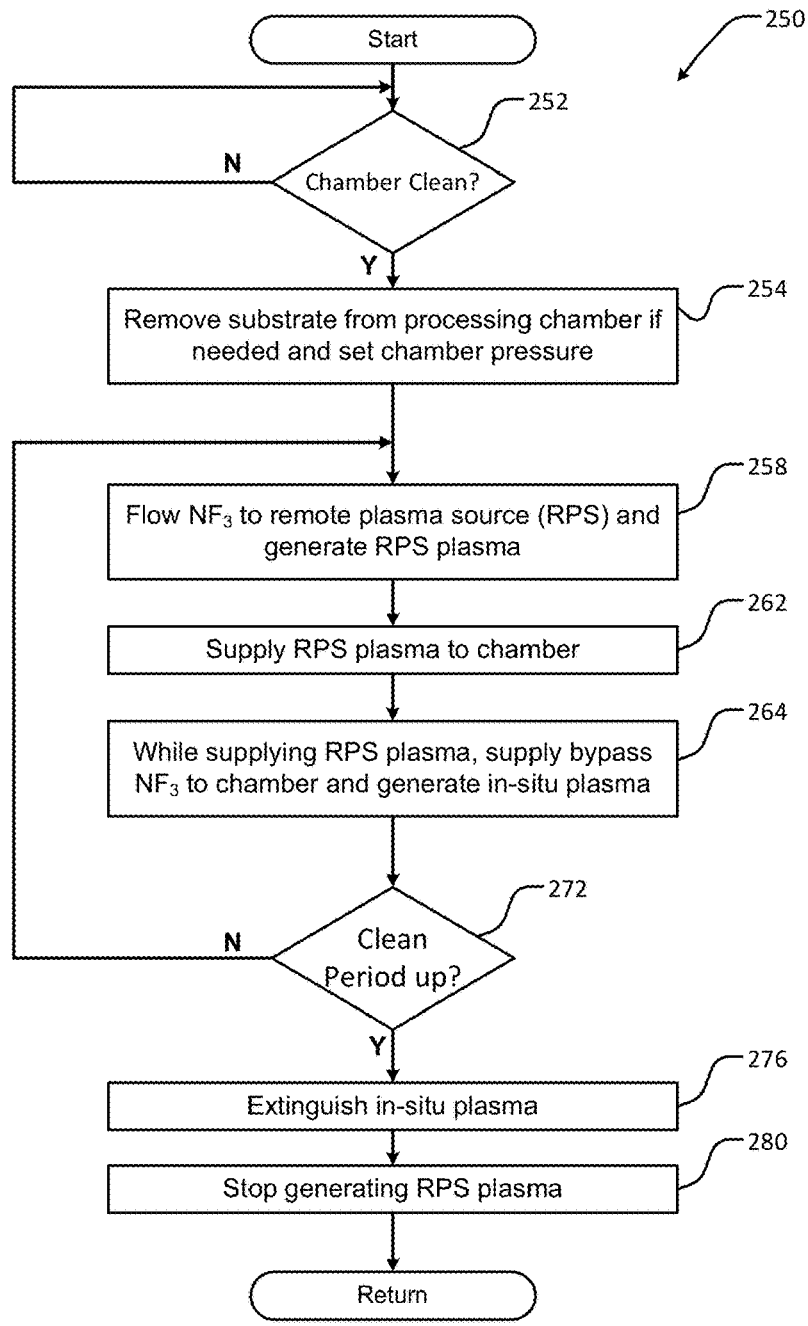
FIG. 2 is a flowchart illustrating an example of a method for performing a chamber clean process according to the present disclosure.

Referring now to FIG. 2, a method 250 for performing a chamber clean process according to the present disclosure is shown. At 252, the method determines whether a chamber clean is to be performed. When 252 is true, the method removes a substrate from the processing chamber if needed and sets chamber pressure to a predetermined pressure range.

In some examples, the predetermined chamber pressure is in a range from 0.25 Torr to 6 Torr. In some examples, the chamber pressure during the cleaning process is adjusted between two or more discrete pressure values. In some examples, a first step is performed at a first pressure range from 2 to 4 Torr during a first portion of the cleaning period and a second step is performed at a pressure from 0.5 to 2 Torr during a second portion of the cleaning period following the first portion. In other examples, a higher pressure step occurs before a lower pressure step. In still other examples, the pressure is reduced or increased monotonically during the cleaning process.

In some examples, a temperature of the substrate support is controlled during the cleaning period to a predetermined temperature in a range between 350° C. and 650° C. In some examples, a temperature of the substrate support is controlled during the cleaning period to a predetermined temperature in a range between 445° C. and 550° C.

At 258, the $NF_3$ gas is supplied to the RPS and RPS plasma is generated. At 262, the RPS plasma is supplied to the processing chamber. While supplying the RPS plasma to the processing chamber, the bypass $NF_3$ gas is supplied to the RPS output conduit or directly to the processing chamber and in-situ plasma is generated by supplying RF power. At 272, the method determines whether the cleaning period is over. When 272 is false, the method continues at 258. Otherwise, the in-situ plasma is extinguished at 276, the RPS plasma is stopped and the method returns.

In some examples, the RPS plasma and in-situ plasma are supplied and struck, respectively, in sequence or at approximately the same time and the in-situ plasma and RPS are extinguished/stopped, respectively, in sequence or at approximately the same time. In other examples, the RPS plasma is supplied at a first time, bypass gas is supplied and in-situ plasma is struck at a second time that occurs a predetermined period after the first time. Both the RPS plasma and in-situ plasma are supplied at the same time during a cleaning period. After the cleaning period, the in-situ plasma and RPS plasma are stopped/extinguished at approximately the same time or the in-situ plasma is extinguished and then the RPS plasma is stopped in sequence with or without intervening periods.

In still other examples, inert gas flow is started for the RPS and RPS plasma is generated. Then, the RPS is switched to $NF_3$ and one or more inert gases. Then, the $NF_3$ bypass gas is supplied for in-situ plasma and the in-situ plasma is struck. In some examples, the $NF_3$ and inert gas flow can be adjusted to final or steady-state setpoint flows. In-situ RF power can be adjusted to final or steady-state RF power levels. The RPS and in-situ cleaning of the chamber is performed for a cleaning period. When the cleaning period is up, the in-situ RF and bypass gas flows are turned off. The RPS $NF_3$ gas flow and RPS plasma are turned off.

Figure 3:
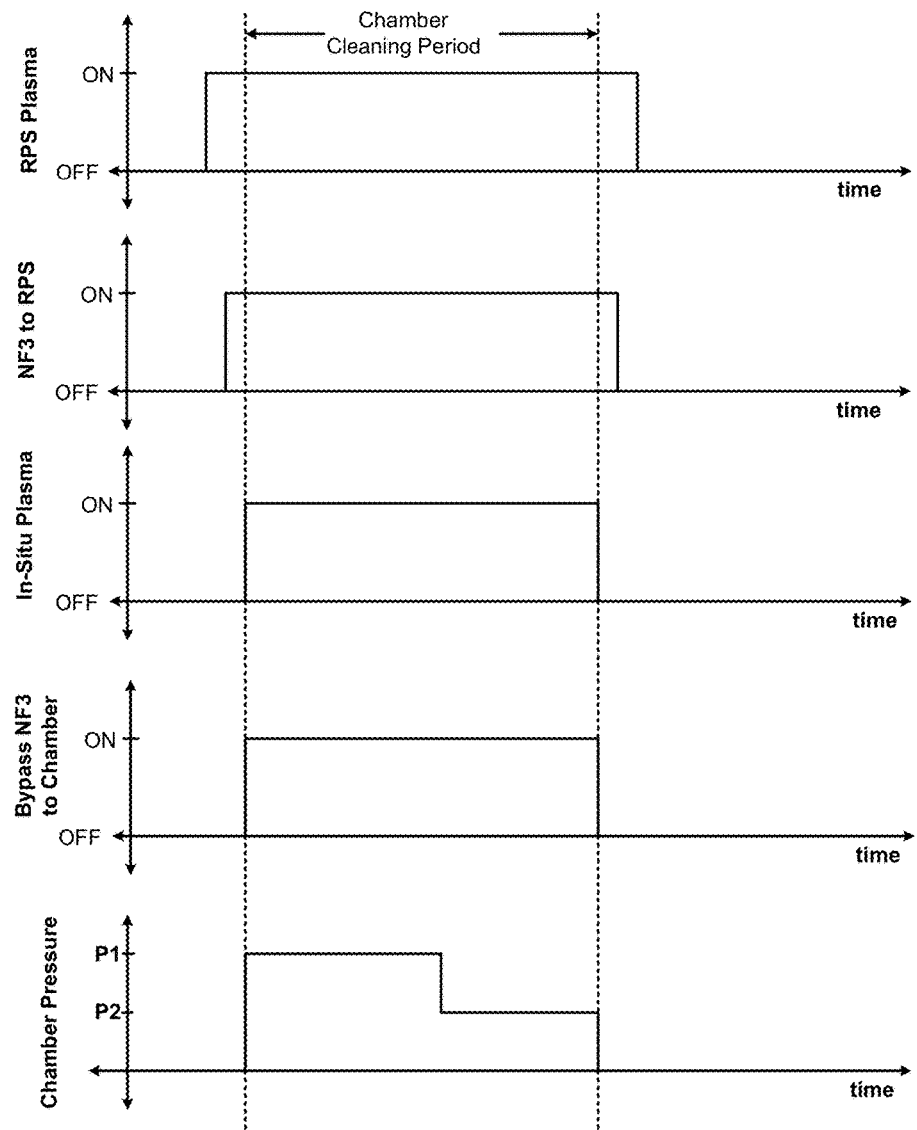
FIG. 3 are examples of timing diagrams for RPS plasma, in situ plasma, supply of RPS and bypass $NF_3$ gas, and chamber pressure during a cleaning period.

Referring now to FIG. 3, an example cleaning process is shown. The $NF_3$ gas is supplied to the RPS and bypass $NF_3$ gas is supplied to the processing chamber. The RPS and in situ plasma are initiated and maintained during the cleaning period. In some examples, the chamber pressure is varied as described above.

Figure 4:
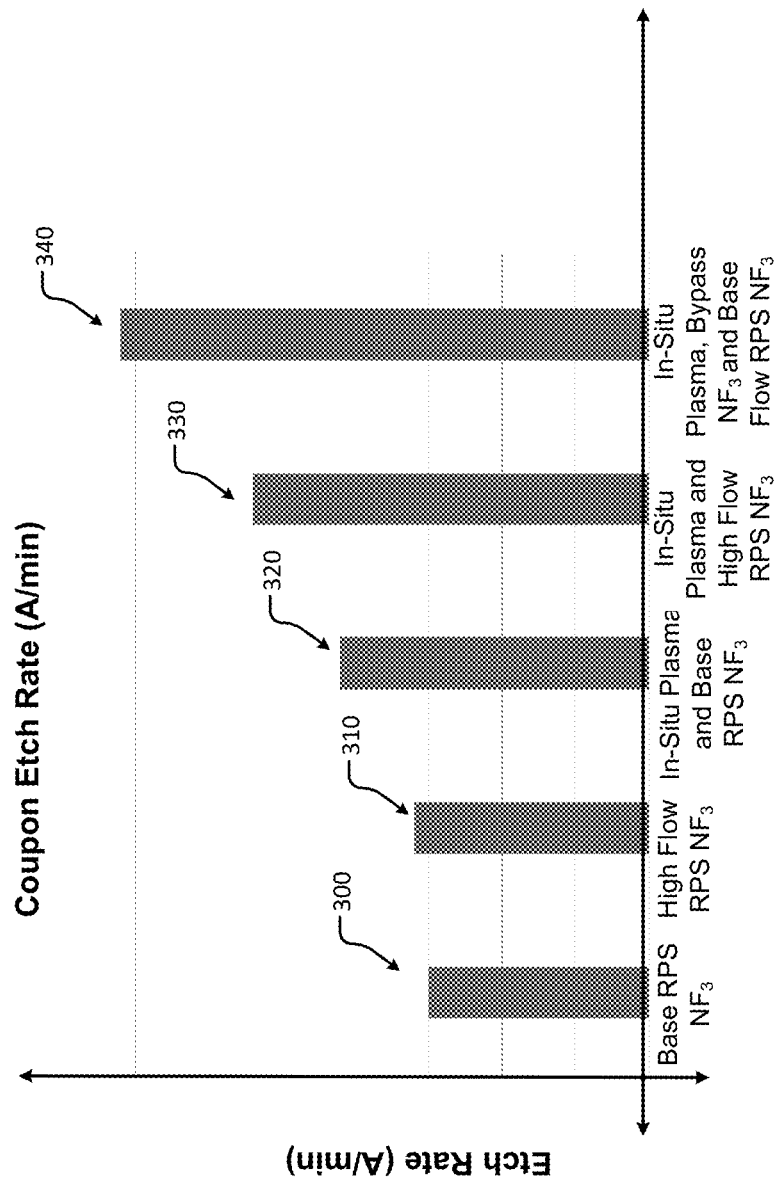
FIG. 4 is a graph illustrating an example of improvements in etch rate measured on a coupon located within the processing chamber during cleaning processes according to the prior art and the present disclosure.

Referring now to FIG. 4, a graph illustrates an example of improvements in etch rate measured on a coupon located within the processing chamber during cleaning processes according to the prior art and the present disclosure. At 300, the processing chamber is cleaned using RPS plasma without in-situ plasma. For example, the $NF_3$ gas is supplied to the RPS at a rate of about 11 slm. At 310, the processing chamber is cleaned using RPS plasma at a higher $NF_3$ gas flow rate without in-situ plasma. For example, the $NF_3$ gas supplied to the RPS is increased to a rate of about 15 slm. As can be seen, there is a slight improvement in etch rate. At 320, the processing chamber is cleaned using RPS plasma and in-situ plasma and without bypass $NF_3$ gas. The $NF_3$ gas is supplied to the RPS at a rate of about 11 slm. As can be seen, there is a slight improvement in etch rate as compared to 310.

At 330, the processing chamber is cleaned using RPS plasma with in-situ plasma and without bypass $NF_3$ gas The $NF_3$ gas is supplied to the RPS at a higher gas flow rate of about 15 slm. As can be seen, there is a slight improvement in etch rate as compared to 320.

At 340, the processing chamber is cleaned using RPS plasma with in-situ plasma and with bypass $NF_3$ gas. The $NF_3$ gas is supplied to the RPS at a rate of about 11 slm and the bypass $NF_3$ gas is supplied gas flow at a rate of about 4 slm. As can be seen, there is significant improvement in etch rate as compared to 300, 310, 320 and 330. The etch rate increased from approximately 80% at 330 to approximately 140% at 340 as compared to the baseline at 300.

Figure 5:
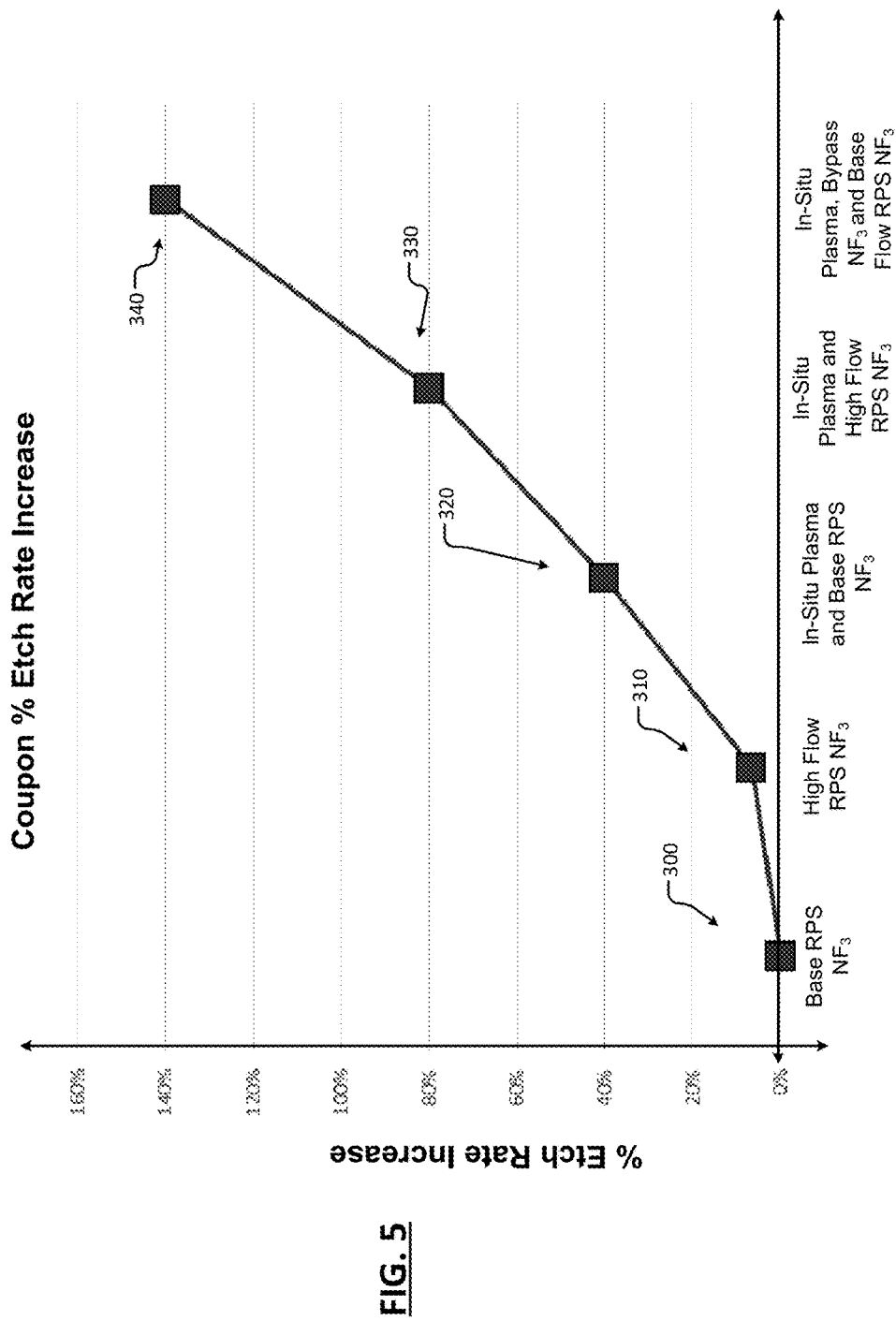
FIG. 5 is a graph illustrating an example of etch rate percentage increase measured on a coupon located within the processing chamber during cleaning processes according to the prior art and the present disclosure.

Referring now to FIG. 5, etch rate percentage increase measured on a coupon located within the processing chamber is shown during cleaning processes 300-340 according to the prior art and the present disclosure. Significant improvements can be seen in the etch rate percentage when using in-situ and RPS plasma in conjunction with bypass $NF_3$ gas.

Referring now to FIG. 6, the chamber clean method described herein reduces a cleaning period for chamber clean processes for equivalent etch performance. In FIG. 6, the process using in-situ and RPS plasma in conjunction with bypass $NF_3$ gas is compared to the baseline clean process 300. In this example, the clean process period is reduced by over 40% as compared to the baseline clean process 300.

In one example, a cleaning period of approximately 90 seconds was used to remove 7 μm of chamber film accumulation. In other examples, the cleaning period varies depending on the amount of film accumulation. In some examples, the cleaning period may be in a range from 20 seconds to 10 minutes. In other examples, the cleaning period may be in a range from 1 minute to 5 minutes.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for cleaning a processing chamber of a substrate processing system, comprising:
   supplying nitrogen trifluoride ($NF_3$) gas to a remote plasma source (RPS);
   generating RPS plasma using the RPS;
   supplying the RPS plasma to the processing chamber;
   supplying $NF_3$ gas as a bypass gas to the processing chamber;
   striking in-situ plasma from the bypass gas in the processing chamber while the RPS plasma is supplied; and
   cleaning the processing chamber during a cleaning period using both the RPS plasma and the in-situ plasma.

2. The method of claim 1, further comprising extinguishing the in-situ plasma and not supplying the RPS plasma to the processing chamber after the cleaning period.

3. The method of claim 1, wherein the substrate processing system performs chemical vapor deposition (CVD).

4. The method of claim 3, wherein the substrate processing system deposits silicon dioxide ($SiO_2$) on a substrate using an oxide precursor gas.

5. The method of claim 4, wherein the oxide precursor gas comprises tetraethyl orthosilicate (TEOS) gas.

6. The method of claim 1, wherein the substrate processing system performs atomic layer deposition (ALD).

7. The method of claim 6, wherein the substrate processing system deposits silicon dioxide ($SiO_2$) using an oxide precursor gas.

8. The method of claim 7, wherein the oxide precursor gas comprises tetraethyl orthosilicate (TEOS) gas.

9. The method of claim 1, wherein the in-situ plasma is generated using RF power in a range from 500 W to 3000 W.

10. The method of claim 1, wherein the in-situ plasma is generated using RF power in a range from 1000 W to 2000 W.

11. The method of claim 1, wherein the in-situ plasma is generated using RF power in a range from 1400 W to 1600 W.

12. The method of claim 1, wherein a gas flow rate to the RPS is within a range from 90% to 110% of a most efficient flow rate for chamber operating parameters during the method.

13. The method of claim 1, wherein a gas flow rate to the RPS is within a range from 95% to 105% of a most efficient flow rate for chamber operating parameters during the method.

14. The method of claim 1, wherein a gas flow rate of $NF_3$ gas to the RPS is in a range from 10 to 12 slm.

15. The method of claim 1, wherein a gas flow rate of $NF_3$ gas to the processing chamber is in a range from 3 to 5 slm.

16. The method of claim 1, further comprising:
maintaining a first pressure in the processing chamber during a first portion of the cleaning period; and
maintaining a second pressure that is different than the first pressure in the processing chamber during a second portion of the cleaning period.

17. The method of claim 16, wherein the first pressure is in a range from 2 to 4 Torr and the second pressure is in a range from 0.5 to 2 Torr.

18. The method of claim 1, further comprising maintaining a temperature of a substrate support in a range between 350° C. and 650° C. during the cleaning period.

19. The method of claim 1, further comprising maintaining a temperature of a substrate support in a range between 445° C. and 550° C. during the cleaning period.

* * * * *